(12) United States Patent
Khoini-Poorfard et al.

(10) Patent No.: US 6,181,212 B1
(45) Date of Patent: Jan. 30, 2001

(54) PHASE LOCKED LOOP FOR GENERATING TWO DISPARATE, VARIABLE FREQUENCY SIGNALS

(75) Inventors: Ramin Khoini-Poorfard, Allentown; Hussein K. Mecklai, Whitehall, both of PA (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/238,990

(22) Filed: Jan. 28, 1999

(51) Int. Cl.[7] .............................. H03L 7/197; H04B 1/26
(52) U.S. Cl. ............................. 331/16; 331/25; 455/118; 455/314; 455/316
(58) Field of Search ........................ 331/16, 25; 455/314, 455/315, 316, 118

(56) References Cited

U.S. PATENT DOCUMENTS

| 4,179,670 | * | 12/1979 | Kingsbury | 331/25 |
|---|---|---|---|---|
| 4,965,531 | * | 10/1990 | Riley | 331/1 A |
| 5,038,117 | * | 8/1991 | Miller | 331/16 |
| 5,430,659 | | 7/1995 | Miller | 364/484 |
| 5,606,736 | * | 2/1997 | Hasler et al. | 455/314 |
| 6,002,273 | * | 12/1999 | Humphreys | 327/3 |

* cited by examiner

Primary Examiner—Siegfried H. Grimm
(74) Attorney, Agent, or Firm—Synnestvedt & Lechner

(57) ABSTRACT

A method and apparatus for generating two disparate frequency reference signals using a single phase locked loop. The circuit includes a local oscillator for generating a reference signal and a phase comparator for comparing the reference signal with a feedback signal. The output of the phase comparator is converted to a first one of the desired output frequencies by a voltage controlled oscillator. That signal is also fed to a variable frequency divider circuit under control of a $\Sigma/\Delta$ converter which generates a lower frequency signal without creating a secondary frequency tone. The lower frequency signal is the second of the output frequencies. This signal also is fed back to the second input of the phase comparator through a fixed frequency divider.

17 Claims, 3 Drawing Sheets

PHASE LOCKED LOOP FOR GENERATING TWO DISPARATE, VARIABLE FREQUENCY SIGNALS

FIELD OF THE INVENTION

The present invention pertains to phase locked loops. More particularly, the present invention pertains to phase locked loops capable of providing multiple output frequencies.

BACKGROUND OF THE INVENTION

While phase locked loop design in accordance with the present invention is applicable to any device utilizing a phase locked loop, it is particularly adapted for radio frequency communication devices in which frequency conversion of a base band signal to the RF (radio frequency) transmission frequency or vice versa is performed in two frequency conversion steps. Using the transmission path of a cellular telephone as an example, a cellular telephone will frequency up-convert a base band signal to the RF transmission frequency, in two frequency mixing (heterodyning) steps. Depending on the particular country and the particular band, the RF transmission frequency for cellular communications may be in the range of about 800 MHz–900 MHz or about 1800 MHz–1900 MHz.

Commonly, a base band signal will first be frequency up-converted to an intermediate frequency (IF) of, for example, about 270 MHz by mixing the baseband signal with an IF reference signal generated at 270 MHz. The IF information signal generated thusly is then frequency up-converted to the RF transmission frequency by mixing it with an RF reference signal generated by a second PLL.

FIG. 1 is a block diagram of an exemplary cellular telephone frequency conversion circuit 10 of the prior art. Both the transmit 11 and receive 13 paths are shown. This circuit is found, for instance, in the W3020 and W3000 chips manufactured by Lucent Technologies, Inc. of Murray Hill, N.J., U.S.A. An incoming differential base band signal, represented in the figure as differential signals $TX_I$, and $TX_Q$, are fed to mixers 12 and 14, respectively. $TX_Q$ is the real part of the signal and $TX_I$ is the imaginary part (phase shifted 90° from the real part) of the signal. Mixers 12 and 14 mix the incoming signals $TX_I$ and $TX_Q$, respectively, with a signal generated by a first local oscillator 16 to perform the first frequency up-conversion on the data signal from the baseband to the intermediate frequency. Local oscillator 16 is, for example, a PLL generating a signal at 540 MHz. That signal is forwarded to a divider circuit 18 which frequency divides the oscillator signal by two or by three depending on the frequency band of operation. Particularly, this circuit is adapted for a dual-band cellular telephone and therefore selectively provides two separate intermediate frequencies, namely, 180 MHz and 270 MHz, depending on the final RF frequency to be achieved. The IF reference signal from the divider 18 is forwarded to phase quadrature circuitry 20. The phase quadrature circuitry creates two signals at the IF reference frequency 90° out of phase with each other and forwards them to the mixers 12 and 14, respectively. The mixers 12 and 14 mix the real and imaginary parts of the base band signal with the real and imaginary portions of the IF reference frequency, respectively, to create real and imaginary signals 22 and 24 at the intermediate frequency. An adder 26 sums the signals to create a complete signal on line 28 at the intermediate frequency containing the information in the original base band signal. That signal is filtered by a band pass filter 30 to eliminate noise and harmonics created by the mixers 12 and 14 and is forwarded to a second mixer 32. Mixer 32 is the RF frequency mixer which will frequency up-convert the IF frequency information signal to the RF transmission frequency. RF mixer 32 mixes the intermediate frequency signal on line 33 with a signal generated by a second local oscillator 34 at an RF frequency displaced 270 MHZ from the desired transmission frequency to generate a side band signal at the desired RF transmission frequency. This local oscillator circuit 34 comprises two alternately selectable PLLs 34a and 34b since many countries, including the U.S. and European countries, have two broad frequency bands within which cellular communications are permitted. Accordingly, a local oscillator is provided for each broad frequency band. Within each of the broad bands is a series of narrower frequency channels from which each cellular telephone will use one channel for a given call. Switch 36 will select the signal from one of the local oscillators depending upon the selected cellular broad band and forward it to amplifier 38. The output of amplifier 38 is fed to the second input of the RF mixer 32 to mix the intermediate signal on line 30 with the RF local oscillator reference signal to create an RF information signal on line 33. That signal is filtered further by band pass filter 43 to eliminate harmonics and background noise, amplified by amplifiers 48 and 50 and forwarded to the antenna 52.

The receive path circuitry 13 is basically the same circuitry in reverse. It comprises a pair of filters 60 and 62, respectively, tuned to the two broad bands permitted for cellular telephone communications by the particular country. Those signals are amplified by low noise amplifiers 64 and 66, respectively, and forwarded to additional filters 68 and 70, respectively. Those signals are mixed by mixers 72 and 74, respectively, with the signals generated by the RF frequency PLL 34a or 34b at a frequency that is displaced 270 MHz from the received RF signal, respectively, to create a side band signal at an intermediate frequency of 270 MHz. Up to this point, both paths (i.e., through elements 60, 64, 68 and 72 and through elements 62, 66, 70 and 74) process the received signal regardless of which broad band it is within even though the output of only one of the paths (the one that is tuned to the frequency of the particular incoming signal) will be used. The outputs of both mixers 72 and 74 are filtered by filter 76 and forwarded to an amplifier 78. Filter 76 not only cleans up the signal, but also acts as a selector of the signal from the appropriate path. Specifically, it will pass only the signal in the path that was tuned for the RF frequency of the particular received signal. The signal sent to the filter that was generated in the other path will not be at 270 MHz because it was mixed with an RF reference frequency that was not offset therefrom by 270 MHz.

The intermediate frequency signal on line 79 is mixed by mixers 80 and 82 with the 270 MHz reference signal generated by the IF PLL 16 as divided by divide by two divider 84 and broken into two components phase shifted 90° from each other by phase differentiator 86. This separates the signal into its real and imaginary parts. The outputs are filtered by filters 88 and 90, respectively, amplified by amplifiers 92 and 94, respectively, filtered further by filters 96 and 98, respectively, and amplified again by amplifiers 100 and 102, respectively. The signals are then passed on to base band processing circuitry.

Each local oscillator 16, 34a, and 34b is comprised of a phase locked loop (PLL) for generating a well regulated frequency signal. A typical PLL includes at least a phase comparator, a voltage controlled oscillator, a charge pump, a feedback loop, an oscillator, filters, amplifiers, and multiple frequency dividers.

The circuit of FIG. 1 requires an IF PLL 16 and a separate RF PLL (in this case a pair of RF PLLs 34a and 34b).

FIG. 2 is a block diagram of a typical phase locked loop circuit that can be used for any of the local oscillator circuits 16, 34a or 34b in FIG. 1. For exemplary purposes, we will consider it to be used for the local oscillator 16 for frequency up-converting the base band signal to an IF signal centered at 270 MHz. The circuit comprises a crystal oscillator 202 generating an oscillating signal at a frequency of 13 MHz. The output of the crystal oscillator is provided to a divide by 13 circuit 204 to generate a 1 MHz signal on line 206. That signal is provided to the first input of a phase comparator 208. The second input of the phase comparator is coupled to the feedback signal 209. The feedback signal is essentially a conditioned version of the frequency controlled output signal of the PLL.

The phase comparator functions in the feedback loop to make the phase (and thus the frequency) of the two signals 206 and 209 presented at its inputs equal by regulating its output accordingly. Specifically, when the phase of the feedback signal 209 leads the phase of the reference signal 206, phase comparator 208 outputs a positive voltage pulse. When the phase of the feedback signal 209 lags the phase of the reference signal 206, phase comparator 208 outputs a negative voltage pulse. If the phases are equal, it generates no signal.

The output of the phase comparator 208 is supplied to a low pass filter 210 which averages the phase difference signal to create a DC average voltage output on line 212. That output is provided to a voltage controlled oscillator (VCO) 214 which increases the frequency of its output in response to a positive voltage and decreases the frequency of its output in response to a negative voltage to generate a signal having a frequency that is a function of the input voltage on line 212. The feedback loop is tuned (by use of dividers) such that the output of the VCO will be a signal having a frequency of 270 MHz when the phases of the reference signal 206 and feedback signal 209 are equal at 1 MHz. Accordingly, the VCO output signal on line 215 is the PLL output signal at the desired frequency of 270 MHz. In order to establish 270 MHz as the PLL's output frequency, this signal 215 is fed back through a divide by 270 circuit 218 to the second input of phase comparator 208. Accordingly, the operation of the feedback loop maintains the output of the VCO at 270 MHz.

It is desirable to reduce the complexity of the overall communications circuit and particularly to reduce the number of local oscillator circuits required to provide the necessary functionality.

SUMMARY OF THE INVENTION

The invention is a method and apparatus by which a single phase locked loop generates output signals at multiple, disparate frequencies effectively and efficiently. The PLL includes a crystal oscillator to create a reference frequency signal as the first input signal to a phase comparator. The second input to the phase comparator is a feedback signal of the PLL. The phase comparator output is fed to a low pass filter to generate a voltage for controlling a voltage controlled oscillator. The output of the voltage controlled oscillator is the first (higher) output frequency of the loop. This signal also is fed to a variable divider that is controlled via a sigma/delta (hereinafter $\Sigma/\Delta$ converter) to set the overall division factor of the divider. In particular, the $\Sigma/\Delta$ converter accepts at its input a voltage indicative of the first desired output frequency. The $\Sigma/\Delta$ converter generates a series of 0s and 1s (e.g., voltage pulses of 0 volts and 1 volt, respectively) that on average corresponds to the input voltage. However, it is the very nature of a $\Sigma/\Delta$ converter that the distribution of the 0s and 1s is essentially random, particularly over any relatively short period of time. Since the distribution of 0s and 1s is random, no large secondary tone is introduced into the feedback loop.

The output of the variable divider then is a second (lower) frequency having no undesired secondary tone therein. This signal also constitutes the feedback signal to the second input of the phase comparator. By placing a second divider between the output of the variable divider and the second input of the phase comparator, the second output frequency of the loop can be set to any integer multiple of the phase comparison frequency used by the phase comparator that is less than the first output frequency of the loop.

In this manner, a single PLL circuit can generate multiple frequencies (e.g., both the IF frequency and the RF frequency for a cellular telephone) using only a single voltage controlled oscillator, a single phase comparator, a single crystal oscillator, and a single feedback loop, thus resulting in significant savings in cost, chip area and circuit complexity.

DETAILED DESCRIPTION OF THE PRESENT INVENTION

Figure 3:
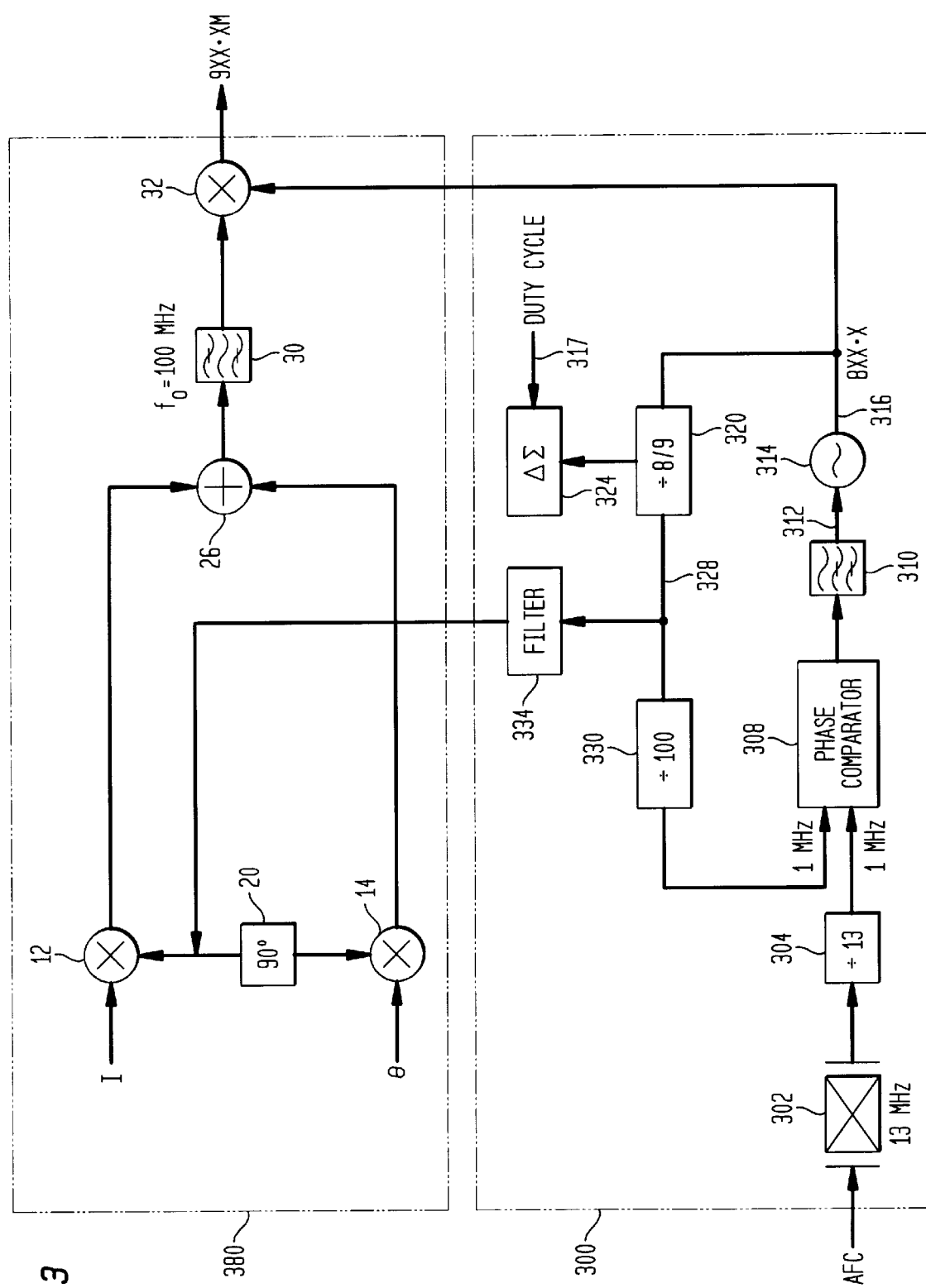
FIG. 3 is a block diagram of a local oscillator circuit in accordance with the present invention.

FIG. 3 is a block diagram of a multi-frequency phase locked loop circuit in accordance with the present invention. For purposes of explanation, we shall assume that we wish to generate two frequencies for a cellular telephone application, namely, an intermediate frequency of 100 MHz and an RF transmission frequency in the range of 800 MHz–900 MHz. Channels within that range are 200 KHz wide and are selectable by a channel select signal.

Figure 1:
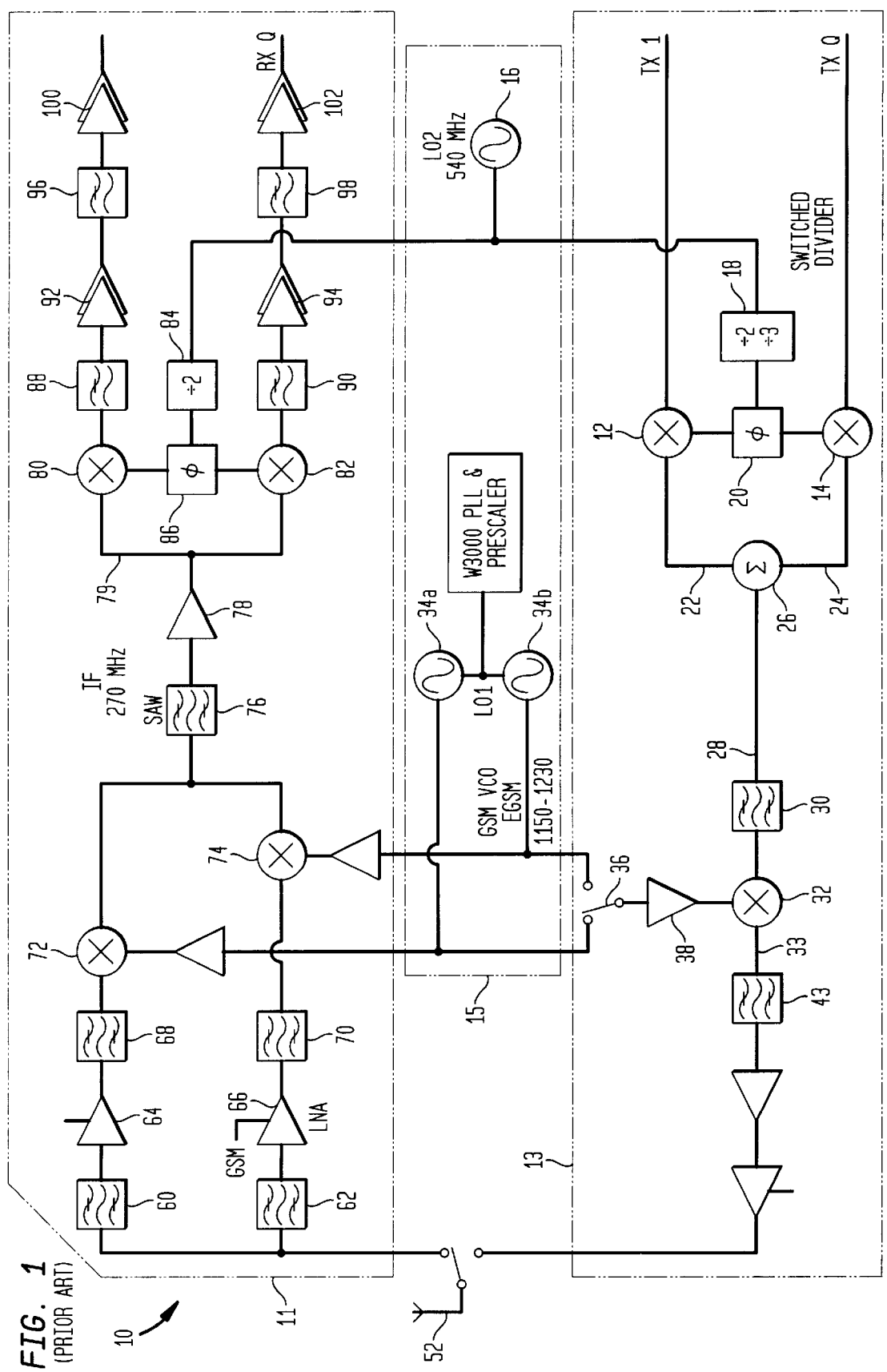
FIG. 1 is a block diagram of a frequency conversion circuit for a cellular telephone of the prior art.
Figure 2:
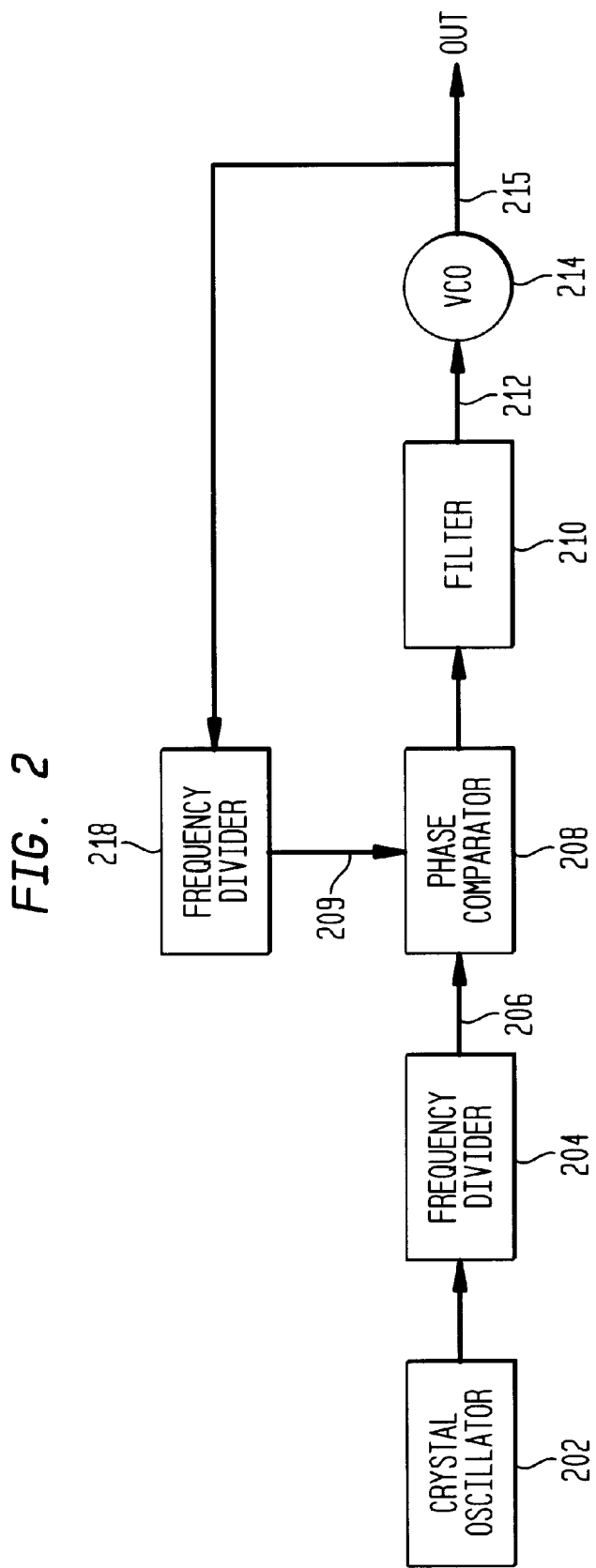
FIG. 2 is a block diagram of an exemplary prior art PLL that can be used as the local oscillators in the circuit shown in FIG. 1.

The single PLL circuit 300 shown in FIG. 3 can replace both local oscillator circuits 16 and 34 of the prior art shown in FIGS. 1 and 2.

The local oscillator circuit 300 comprises a crystal oscillator 302 followed by a divider circuit 304. In this particular example, the crystal oscillator generates a signal at 13 MHz which is reduced to 1 MHz by a divide by 13 circuit 304. The 1 MHz reference signal on line 306 is provided to a first input of a phase comparator 308. The signal presented to the second input of the phase comparator that is compared to the reference frequency signal is a feedback signal to be described in detail further below.

As in the prior art, the output of the phase comparator is a signal indicative of the difference in phase of the two input signals. Particularly, in at least one type of phase comparator, the phase comparator issues a pulse on an UP line having a duration corresponding to the difference in phase between the reference signal and the feedback signal when the phase of the reference signal leads the phase of the feedback signal. The phase comparator issues a pulse on its DOWN line having a duration corresponding to the difference in phase between the reference signal and the feedback signal when the phase of the reference signal lags the phase of the feedback signal. When the phases are equal, no signal is generated on either line. In a manner well known in the prior art, the UP and DOWN signal lines control a current source and a current sink, respectively, so as to generate a current pulse that is indicative of the direction and magnitude of the phase difference between the two signals.

The difference signal is fed to a low pass filter 310, the output of which is essentially an average DC voltage that is a function of the phase difference signal. Particularly, the filter 310 acts essentially as an integrator of the phase difference signal. The output of the low pass filter 310 is a voltage on line 312 to a voltage controlled oscillator 314. The voltage controlled oscillator generates a signal having a frequency that is a function of the input voltage on line 312 as described above in connection with the VCO of FIG. 2. The output of the VCO 314 on line 316 is the RF local oscillator output signal (the RF reference signal). Thus, it is fed to one of the inputs of the RF frequency mixer 32 in box 380. Note that the circuitry in box 380 constitutes the mixing circuitry of the prior art which also is shown in FIG. 1. Like numerals are used in FIGS. 1 and 3 to reference like components.

The output on line 316 also is provided to a variable frequency divider 320, i.e., a frequency divider that can selectively divide the signal provided at its input by at least two division factors. Note that this definition includes not only dividers that can provide different output frequencies responsive to the same frequency input signal by adjusting its division factor, but also dividers with a fixed overall division factor wherein that division factor is a non-integer division factor that is rendered by alternately dividing by two different integer division factors. (Generally, frequency dividers can divide frequency only by integer values and therefore non-integer division factors are rendered by interspersing different integer division factors over time). In the present example, it is a divide by 8/9 divider. This means that the divider will divide the frequency of the input signal on line 316 by 8 or by 9 depending on the control signal supplied on line 317. That control signal is provided to the variable divider by a Σ/Δ converter 324. The output 328 of the divider circuit 324 is the IF local oscillator output signal (the IF reference signal). Accordingly, it is supplied to the intermediate frequency signal mixer circuitry in box 380 comprising phase quadrature circuitry 20, and mixer circuits 12 and 14. As previously described, those mixers mix the real and imaginary portions of the base band signal with the IF reference signal in order to frequency up-convert the baseband signal to the intermediate frequency band.

The intermediate frequency reference signal 328 also is provided to a divide by 100 circuit 330. The output of the divide by 100 circuit is the feedback signal that is provided to the second input of the phase comparator 308 and which is compared to the 1 MHz reference signal on line 306.

By selectively controlling the variable divider circuit 320 to divide by 8 or divide by 9, the RF frequency local oscillator signal on line 316 can be controlled to be anywhere between 800 MHz and 900 MHz. The fixed divider 330, however, maintains the intermediate frequency on line 328 at 100 MHz regardless of the RF output signal on line 316. Particularly, since the divide by 100 circuit 330 divides by a fixed factor and because the feedback system will always force the phase comparator towards an output which will make its inputs equal in frequency, the intermediate frequency will always be 100 MHz.

However, the voltage controlled oscillator output 316 is variable because the RF reference signal frequency will equal the reference input to the phase comparator multiplied by the overall division factor in the feedback loop. For instance, if the variable divider 320 were set to divide by 8 consistently, then the overall division factor of the loop would be 100×8 or 800. Therefore:

RF reference frequency=1 MHz×100×8=800 MHz.

Alternately, if the variable divider 320 were set to divide by 9 consistently, then:

RF reference frequency=1 MHz×100×9=900 MHz.

In the circuit of FIG. 3, the number of times, y, per 1000 that the variable divider circuit divides by 9 rather than 8 is given by the equation:

$$y=(F_c-800)\times 10$$

where $F_c$=the RF output frequency on line 316 (in MHz).

The number of times per 1000 that the variable divider 324 divides by 9 is dictated by channel select signal 317. However, the channel select information is provided to the variable divider through a Σ/Δ converter 324. The channel select signal 317 is a DC voltage that indicates the channel (i.e., the particular RF frequency) to be generated by the PLL. For instance, the channel select signal may be adapted such that 0 volts corresponds to a desired 800 MHz output signal and 1 volt corresponds to a desired 900 MHz output signal with values between 0 and 1 volts converting to desired frequencies in a direct ratio relationship. Thus for instance 0.2 volts would correspond to 820 MHz.

The variable divider is controlled to alternately divide by 8 and 9 so as to provide an overall average division factor that gives the desired output frequency as dictated by the channel select signal 317.

For instance, if the desired RF frequency for the RF output of the PLL is 820 MHz, then the channel select signal is set to 0.2 volts. To provide an output on line 316 of 820 MHz, the average division factor of the variable divider 320 must be 8.2. This means that the divider must divide by 8 four-fifths of the time, and divide by 9 one-fifth of the time. Thus, the long-term division factor of the divider will be 8.2 and the output will be 820 MHz.

However, simply dividing by the 9 at regular intervals (i.e., periodically) will introduce a secondary frequency into the feedback loop at the frequency:

$$f_{2dary} = \frac{(\text{Input frequency to divider})}{(\text{ratio of second division factor to first division factor})}$$

Thus, if the overall division factor is made 8.2 by providing a 1:5 ratio of the second division factor (9) to the first division factor (8) and the divider input signal is 820 MHz, then a secondary frequency is introduced into the loop at $$\frac{820 \text{ MHz}}{5} = 164 \text{ MHz}.$$

In a practical embodiment of a cellular telephone, for example, this frequency is very close to the desired IF which might commonly range from about 100 MHz–500 MHz and therefore cannot be filtered out effectively.

In order to avoid this problem, the channel select signal is passed through a Σ/Δ converter before being applied to the variable divider. The Σ/Δ converter generates a series of one bit wide binary values (e.g., 1 volt or 0 volts) that, on long term average, corresponds to the input DC voltage. Thus, in the 820 MHz example we have been using, the Σ/Δ converter will, on average, in response to a DC voltage of 0.2 volts on the channel select line at its input, generate four 0s for every 1 it generates. Particularly, the Σ/Δ converter generates a series of one bit wide binary values (e.g., 1 volt or 0 volts) that, on long term average, correspond to the input DC voltage (0.2 volts). However, the distribution of is and 0s generated by the Σ/Δ converter will be random over any short time period. If the variable divider is adapted to divide by 8 in response to receipt of a binary 1 (1 volt) at its control input terminal and to divide by 9 in response to receipt of a binary 0 (0 volts) at its control input terminal, then, on average, it will divide by an overall division factor of 8.2 (directly corresponding to the DC voltage on the channel select signal line, i.e., 0.2 volts). This will cause the output signal to be at a frequency of 820 MHz, but no large tone at any secondary frequency will be generated because, due to the very nature of a Σ/Δ converter, the distribution of 1s and 0s is irregular. Accordingly, no secondary tone is introduced into the feedback loop that would be amplified within the loop.

In essence, it is the very nature of a Σ/Δ converter to generate an output that tracks its input signal on average, but suppresses higher frequency components. Accordingly, responsive to channel select signal 317, the Σ/Δ converter 324 will generate a signal that, on average asks the divider 320 to divide by 9 once every five times. However, it will not ask the divider to do so at regular intervals. Rather, it will do so essentially randomly. Instead of generating a secondary tone at a specific frequency, the overall white noise in the loop is increased slightly.

In most situations, the increase is so slight as to not require any additional filtering. However, in very high precision applications, a 100 MHz band pass filter 334 may be employed in the path of the intermediate frequency output signal.

The randomness of the Σ/Δ converter output is a function of the order of the converter. In most applications, a first order converter should be adequate. However, by use of second order and higher converters, the randomness of the generation of is and 0s can be increased even further.

It can be seen that this particular circuit generates both an intermediate frequency signal at a fixed frequency (100 MHz) and a radio frequency signal anywhere between 800 and 900 MHz depending on the channel select signal 317. It does so using only one feedback loop, one phase comparator, and one crystal oscillator. The use of a Σ/Δ converter to control the variable divider circuit allows frequency selection at one of the generated local oscillator frequencies without affecting the other of the local oscillator frequencies and without introducing an undesirable secondary frequency tone into the feedback loop. This circuit is more economical from a cost, power, and area perspective.

Although described above with respect to a dual frequency application in a cellular telephone, it should be apparent that a phase locked loop in accordance with the present invention can be used in essentially any application requiring one or more stable reference voltages. Also, it should be clear to persons of skill in the related arts that a phase locked loop in accordance with the present invention can be adapted to generate any number of output frequencies simply by adding further dividers in the feedback loop and taking an output tap between the dividers. Any variable dividers should be controlled through a Σ/Δ converter as described hereinabove. Also, it should be clear that a PLL in accordance with the teachings of the present invention can be used to generate any frequency within any range.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

What is claimed:

1. An integrated circuit having a phase locked loop circuit, said phase locked loop circuit generating first and second local oscillator output signals, comprising:

an oscillator having an output;

a phase comparator having a first input coupled to said output of said oscillator, said phase comparator further having a second input and an output, said output indicative of a phase difference between signals at its first and second inputs;

a voltage controlled oscillator having an input coupled to said output of said phase comparator and an output, said voltage controlled oscillator generating a signal at its output having a frequency that is a function of the output of the comparator, said output comprising said first local oscillator output signal;

a first frequency divider having an input coupled to said output of said voltage controlled oscillator, and an output coupled to said second input of said phase comparator, said first frequency divider capable of dividing the frequency of a signal presented to its input by at least first and second division factors and having a control input for accepting a signal to select said division factor, said output of said first frequency divider comprising said second local oscillator output signal; and a Σ/Δ converter having an output coupled to said control input of said first frequency divider for setting an average division factor of said first frequency divider, said Σ/Δ converter being controlled by a control signal establishing the frequency to be generated at said output of said first frequency divider.

2. A integrated circuit as set forth in claim 1 wherein said first frequency divider is adjustable such that said frequency of said first output signal is variable.

3. An integrated circuit as set forth in claim 2 further comprising a second frequency divider coupled between the output of said first frequency divider and said second input of said phase comparator.

4. An integrated circuit as set forth in claim 3 further comprising a band pass filter coupled between said output of said first frequency divider and an output terminal of said phase locked loop at which said second local oscillator output signal is presented, said band pass filter tuned to pass said frequency of said second local oscillator output signal.

5. An integrated circuit as set forth in claim 4 further comprising a low pass filter coupled between said output of said phase comparator and said input of said voltage controlled oscillator.

6. An integrated circuit as set forth in claim 5 wherein said first output signal is a radio frequency reference signal for mixing with an information signal to frequency convert said information signal from a first frequency band to a second frequency band and wherein said second output signal is an intermediate frequency for mixing with said information signal to frequency convert said information signal from said second frequency band to a third frequency band.

7. An integrated circuit as set forth in claim 6 further comprising a third frequency divider coupled between said oscillator and said first input of said phase comparator.

8. An integrated circuit as set forth in claim 7 wherein said oscillator is a crystal oscillator.

9. A radio frequency communications device comprising:
a local oscillator circuit for generating at least first and second local oscillator signals at first and second frequencies, respectively, each for mixing with an information signal in order to frequency convert said information signal, said local oscillator circuit comprising:
an oscillator for generating a reference signal having a reference frequency;
a phase comparator coupled to compare a phase of said reference signal with a phase of a feedback signal for generating a phase difference signal;
a voltage controlled oscillator coupled to said phase difference signal for generating said first local oscillator frequency signal;
a frequency divider coupled to said first local oscillator frequency signal, said frequency divider capable of dividing said first local oscillator frequency by at least first and second division factors in order to generate said second local oscillator frequency signal, said frequency divider having a control input for accepting a signal to select said division factor; and
a $\Sigma/\Delta$ converter having an output coupled to said control input of said frequency divider for setting an average division factor of said frequency divider, said $\Sigma/\Delta$ converter being controlled by a control signal establishing the second local oscillator frequency.

10. A radio frequency communications device as set forth in claim 9 wherein said first local oscillator frequency signal is variable, said variability being dictated by control of said frequency divider.

11. A radio frequency communications device as set forth in claim 10 wherein said first local oscillator frequency signal is a radio frequency reference signal for mixing with an information signal to frequency convert said information signal from a first frequency band to a second frequency band and wherein said second local oscillator frequency signal is an intermediate frequency for mixing with said information signal to frequency convert said information signal from said second frequency band to a third frequency band.

12. A radio frequency communications device as set forth in claim 11 wherein said radio frequency communications device is a cellular telephone.

13. A method of generating at least first and second signals at first and second frequencies, respectively, said method comprising the steps of:
generating a reference frequency signal;
comparing said reference frequency signal to a feedback signal to generate a difference signal indicative of a difference in frequency of the two signals;
generating a signal as a function of said difference signal, said signal being said first signal at said first frequency;
dividing the frequency of said first signal by an average division factor, whereby said second signal at said second frequency is generated;
feeding back said second signal for comparison with said reference signal;
controlling said division factor by a control signal that establishes a division factor of a first value interspersed with a division factor of a second value such that, on average, said division factor is said average division factor; and
randomizing the intervals at which said division factor is switched from said first value to said second value.

14. A method as set forth in claim 13 wherein said randomizing step comprises passing said control signal through a $\Sigma/\Delta$ converter.

15. A method as set forth in claim 13 wherein said first and second division factors are integer values and said average division factor is a non-integer value.

16. A method as set forth in claim 15 wherein said first frequency is variable under control of said control signal.

17. A method as set forth in claim 16 wherein a duty cycle of said control signal establishes said average division factor.

* * * * *